United States Patent [19]

Doessel

[11] Patent Number: 4,916,046

[45] Date of Patent: Apr. 10, 1990

[54] POSITIVE RADIATION-SENSITIVE MIXTURE, USING A MONOMERIC SILYLENOL ETHER AND A RECORDING MATERIAL PRODUCED THEREFROM

[75] Inventor: Karl-Friedrich Doessel, Wiesbaden, Fed. Rep. of Germany

[73] Assignee: Hoechst Aktiengesellschaft, Frankfurt am Main, Fed. Rep. of Germany

[21] Appl. No.: 243,819

[22] Filed: Sep. 13, 1988

[30] Foreign Application Priority Data

Sep. 13, 1987 [DE] Fed. Rep. of Germany ....... 3730783

[51] Int. Cl.$^4$ .............................................. G03C 1/495
[52] U.S. Cl. .................................... 430/281; 430/270; 430/175; 430/326
[58] Field of Search ............... 430/326, 281, 175, 270; 526/279; 556/482

[56] References Cited

U.S. PATENT DOCUMENTS

| | | | |
|---|---|---|---|
| 3,779,778 | 12/1973 | Smith et al. | 96/115 R |
| 4,101,323 | 7/1978 | Buhr et al. | 96/35 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,544,724 | 10/1985 | Sogah et al. | 526/279 |
| 4,603,101 | 7/1986 | Crivello | 430/270 |
| 4,737,426 | 4/1988 | Roth | 430/17 |
| 4,739,021 | 4/1988 | Harris, Jr. | 526/90 |
| 4,752,552 | 6/1988 | Aoai et al. | 430/191 |
| 4,770,977 | 9/1988 | Buiguez et al. | 430/323 |
| 4,786,577 | 11/1988 | Aoai et al. | 430/192 |
| 4,822,716 | 4/1989 | Onishi et al. | 430/192 |

FOREIGN PATENT DOCUMENTS 3544165 6/1986 Fed. Rep. of Germany .
3601264 7/1986 Fed. Rep. of Germany .

*Primary Examiner*—Paul R. Michl
*Assistant Examiner*—C. D. RoDee
*Attorney, Agent, or Firm*—Foley & Lardner, Schwartz, Jeffery, Schwaab, Mack, Blumenthal & Evans

[57] ABSTRACT

The invention relates to a positive radiation-sensitive mixture containing a compound which forms an acid under the action of actinic radiation, an acid-cleavable compound, and a binder, wherein the acid-cleavable compound comprises a monomeric silylenol ether. The radiation-sensitive mixture described has a better shelf life than the prior art products and a high structural resolution.

18 Claims, No Drawings

POSITIVE RADIATION-SENSITIVE MIXTURE, USING A MONOMERIC SILYLENOL ETHER AND A RECORDING MATERIAL PRODUCED THEREFROM

BACKGROUND OF THE INVENTION

The present invention relate to a positive radiation-sensitive mixture containing a compound which forms an acid under the action of actinic radiation and an acid-cleavable compound.

Positive radiation sensitive mixtures in which an acid is formed through the action of actinic radiation on a photoinitiator and the acid then, in a secondary reaction, renders the irradiated regions of an acid-cleavable material soluble in an appropriate developer have been known for some time.

Of the acid-cleavable materials employed hitherto in this area, the following have proven successful:

(a) those containing at least one orthocarboxylic ester and/or carboxamide acetal group, it being possible for the compounds to have a polymeric character and for the groups mentioned to occur as linking elements in the main chain or as lateral substituents, (b) oligomeric or polymeric compounds containing recurring acetal and/or ketal groups in the main chain, (c) compounds containing at least one enol ether or N-acyliminocarbonate group, (d) cyclic acetals or ketals of $\beta$-keto esters or amides, and (e) compounds containing silyl ether groups.

As components of radiation-sensitive mixtures, acid-cleavable compounds of type (a) are described in detail in EP-A-0,022,571 and DE-A-2,610,842; mixtures which contain compounds of type (b) are described in DE-C-2,306,248 and DE-C-2,718,254; compounds of type (c) are mentioned in EP-A-0,006,626 and 0,006,627, compounds of type (d) are mentioned in EP-A-0,202,196: compounds belonging to type (e) are presented in DE-A3,544,165 and 3,601,264.

It was possible to achieve high radiation-sensitivity or photosensitivity in the case of the orthoesters, the amidoacetals, the enol ethers or the N-acyliminocarboxylic acids. However, such compounds have the disadvantage of poor shelf life.

Although oligomeric or polymeric compounds containing recurring acetal and/or ketal groups in the main chain have high radiation sensitivity, their field of use is limited because of their property as a plasticizer for the polymer matrix. In addition, the processing tolerances are low as a consequence of the choice of hydrolysis products.

The same inadequacies are also observed in polymeric, acid-cleavable materials described in US-A-4,603,101. The monomers from which the polymeric materials mentioned therein are formed are tertiary-substituted organomethyl vinylaryl ethers, in particular tert-butyl vinylaryl ethers.

In order to link the factors "etching resistance" and "cleavage chemistry," compounds have been developed which contain acid-cleavable silyl ether groups. However, these compounds exhibit impaired shelf life and a noticeable impairment in radiation sensitivity.

SUMMARY OF THE INVENTION

It is therefore an object of the present invention to provide a positive radiation-sensitive mixture which has an improved shelf life, offers good processing latitude, even with respect to etching processes, makes possible high structural resolutions and can be employed in photocatalytic resists, even for relatively short-wave light, for example, electron-beam or X-ray radiation.

These and other objects are achieved by providing a positive radiation-sensitive mixture comprising a compound that forms an acid under the action of actinic radiation, and an acid-cleavable compound, wherein the acid-cleavable compound contains a silylenol ether of the general formula I

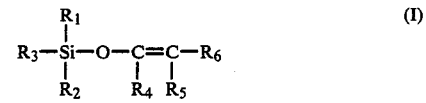

in which $R_1$ and $R_2$ are identical or different and denote alkyl, cycloalkyl or aryl, $R_3$ denotes alkyl, cycloalkyl, aryl or —O—$R_7$, $R_4$, $R_5$ and $R_6$ are identical or different and denote hydrogen, alkyl, cycloalkyl, alkenyl, cycloalkenyl or aryl, and $R_7$ denotes hydrogen, alkyl, cycloalkyl, alkenyl, cycloalkenyl, aryl or silyl.

A recording material comprising a layer of the positive radiation-sensitive mixture on a substrate is also provided.

A process for producing an imaged recording material comprises the steps of applying a layer of the radiation-sensitive mixture to a substrate, drying the layer, irradiating the dried layer imagewise, and developing the irradiated layer with an aqueous-alkaline developer to produce an image.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Acid-cleavable compounds according to the present invention comprise a silylenol ether of the general formula I

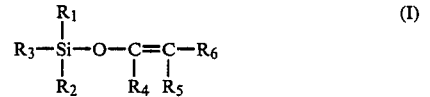

in which, $R_1$ and $R_2$ are identical or different and denote alkyl, cycloalkyl or aryl, $R_3$ denotes alkyl, cycloalkyl, aryl or —O—$R_7$, $R_4$, $R_5$ and $R_6$ are identical or different and denote hydrogen, alkyl, cycloalkyl, alkenyl, cycloalkenyl or aryl, and $R_7$ denotes hydrogen, alkyl, cycloalkyl, alkenyl, cycloalkenyl, aryl or silyl.

In particular, $R_1$ and $R_2$ are identical or different and denote ($C_1$-$C_3$)alkyl, preferably methyl, $C_5$- or $C_6$-cycloalkyl or ($C_6$-$C_{10}$)aryl, preferably phenyl;

$R_3$ denotes $(C_1-C_6)$alkyl, preferably methyl, $C_5$- or $C_6$-cycloalkyl, $(C_6-C_{10})$aryl, preferably phenyl, or —O—$R_7$;

$R_4$, $R_5$ and $R_6$ are identical or different and denote hydrogen, $(C_1-C_3)$ alkyl, alkenyl, cycloalkenyl or aryl, the C—C double bonds in these radicals preferably being conjugated with the double bond in —$CR_4$=$CR_5$—, and $(C_1-C_6)$alkenyl and $C_5$- or $C_6$-cycloalkenyl preferably provide only one double bond for conjugation; or aryl preferably denotes phenyl, which is optionally substituted by alkyl, alkoxy, halogen and hydroxyl, and optionally etherified with alkyl- or arylhalosilanes; and $R_7$ denotes $(C_1-C_6)$alkyl, $(C_5-C_{10})$cycloalkyl, $(C_1-C_6)$alkenyl, $(C_5-C_{10})$cycloalkenyl and $(C_6-C_{10})$aryl, in particular, phenyl, or silyl.

It is particularly preferred when $R_3$ is —O—$R_7$ and therein $R_7$ denotes —$CR_4$=$CR_5$—$R_6$, and, in addition, $R_1$ and $R_2$ are only identical when they are $(C_1-C_3)$-alkyl, preferably methyl.

If $R_1$ and $R_2$ are different, only $R_1$, in particular, is $C_5$- or $C_6$-cycloalkyl or $(C_6-C_{10})$aryl, preferably phenyl.

In this case, it is also particularly preferred when $R_4$ and $R_5$ are cyclized to form a cycloaliphatic ring, so that a cyclopentenyl or cyclohexenyl ring forms;

$R_6$ is in this case preferably hydrogen, but may alternatively denote aryl or alkenyl, in particular, when the double bonds thereof are conjugated with —$CR_4$=$CR_5$—. It It is likewise preferred when $R_3$ is not —O—$R_7$, and $R_1$ and $R_2$ are preferably identical and denote $(C_1-C_3)$alkyl, $C_5$- or $C_6$-cycloalkyl or $(C_6-C_{10})$-aryl, preferably phenyl.

In this case, it is very particularly preferred when $R_1$, $R_2$ and $R_3$, in a maximum of only two radicals, in particular in $R_1$ and $R_2$, denote a cyclic radical, preferably a cycloalkyl or phenyl radical, and $R_3$ is $(C_1-C_6)$alkyl.

$R_5$ and $R_6$ may in this case denote, in particular, hydrogen, and $R_4$ is then preferably alkenyl, cycloalkyl, preferably phenyl, particularly preferably when substituted by a silyl ether radical, in particular in the ortho- or para-position, its substituents, in particular, agreeing with $R_1$, $R_2$ and $R_3$.

Or alternatively $R_4$ and $R_5$ are cyclized to form a cycloaliphatic ring so that a cyclopentenyl or cyclohexenyl ring forms, $R_6$ is in this case preferably hydrogen, but may alternatively denote alkenyl or aryl in which the double bonds are preferably conjugated with —$CR_4$=$CR_5$—.

The silylenol ether compounds present in the radiation-sensitive mixtures according to the invention may be monomeric compounds or polymers. In the case of polymers, the halosilanes must be at least bifunctional, i.e., contain at least two halogen atoms, and the aldehydes or ketones reacted must contain at least two carbonyl groups. However, monomers are preferred, including products of the reaction of 1 mole of halosilane and 1 mole of aldehyde or ketone, or alternatively products of 1 mole of a bifunctional or trifunctional halosilane compound and 2 or 3 moles of an aldehyde or ketone.

The acid-cleavable silylenol ether compounds may additionally contain silyl ether groups, preferably in a ratio of 1:1 to one another, which can also be removed by acid. However, it is also possible to employ pure silylenol ether compounds mixed with silyl ether compounds. In this case, a molar ratio from 0.1:1 to 0.5:1 (silyl ether compound silylenol ether compound) is preferred. However, the unblended pure silylenol ether compound is very particularly preferred.

The content of silylenol ether compounds, including compounds which contain additional silyl ether groups, and also of compounds which are mixed with pure silyl ether compounds is generally about 2% to 50% by weight, preferably about 10% to 25% by weight, in each case relative to the total weight of the mixture.

Suitable components which, in the radiation-sensitive mixture according to the invention, preferably form or eliminate a strong acid on irradiation include a large number of compounds and mixtures thereof. Diazonium, phosphonium, sulfonium and iodonium salts, halogen compounds, o-quinone-diazide sulfochlorides and sulfonates and also organometallic/organohalogen combinations are included.

In the description which follows, the contents of recited references are hereby incorporated by reference.

The diazonium, phosphonium, sulfonium and iodonium compounds mentioned are generally employed in the form of their organic solvent-soluble salts, usually as deposition products with complex acids such as tetrafluoroboric acid, hexafluorophosphoric acid, hexafluoroantimonic acid and hexafluoroarsenic acid. Inter alia, these compounds are mentioned in DE-A-3,601,264.

The halogen compounds include, in particular, triazine derivatives, which are known from US-A-3,515,552, 3,536,489 and 3,779,778, and DE-C-2,718,259, 3,337,024, 3,333,450, 2,306,248, 2,243,621 and 1,298,414. However, they can also be employed in combination with other photoinitiators, such as oxazoles, oxadiazoles or thiazoles, and in mixtures with one another.

However, oxazoles, oxadiazoles, thiazoles or 2-pyrones which contain trichloromethyl or tribromomethyl groups are also known (DE-A-3,021,599, 3,021590, 2,851,472 and 2,949,396 and EP-A-0,135,348 and 0,135,863).

Also included are, in particular, aromatic compounds which contain ring-bound halogen, preferably bromine. Such compounds are known from DE-A-2,610,842 or are described in U.S. application Ser. No. 07/243922 (corresponding to German Patent Application P 3,730,784.3), filed simultaneously.

A representative of a combination with a thiazole which may be mentioned is one with 2-benzoylmethylene-naphtho[1,2-d]thiazole (DE-A-2,851,641 and DE-A-2,934,758). A mixture of a trihalomethyl compound with N-phenylacridone is known from DE-A-2,610,842.

Likewise, α-halocarboxamides (DE-A-2,718,200) or tribromomethyl phenyl sulfones (DE-A-3,503,113), which can be sensitized, for example, by benzophenone, benzil or Michler's ketone, are also available.

In general, the efficiency of all the photosensitive or radiation-sensitive compounds described can be supported by photosensitizers. Anthracene, phenanthrene, pyrene, 1,2-benzanthrene, thiazines, pyrazolines, benzofurans, benzophenones, fluorenones, anthraquinones and coumarine derivatives, for example, may be mentioned. Their content is about 0.01% to 5% by weight, relative to the weight of the radiation-sensitive mixture.

Above all, triazine derivatives and aromatic compounds containing ring-bound halogen, in particular bromine, known from DE-A-2,610,842 and U.S. patent application Ser. No. 07/243,922 (corresponding to German Patent Application P 3,730,784.3), filed simultaneously, are particularly preferred. These compounds are preferably only cleaved by high-energy radiation, i.e., short-wave radiation. In addition to UV radiation, this includes, above all, electron-beam radiation or X-ray radiation.

Besides monomeric radiation-sensitive compounds, it is also possible to employ polymers of this type. When monomeric initiators are used, their content is in the range of about 0.01% to 30% by weight, in particular, about 0.4% to 20% by weight, relative to the weight of the radiation-sensitive mixture.

If polymeric initiators are used, it may be possible to omit a polymeric binder. This has the consequence that, depending on its proportion of the content of the polymer in this mixture, its content may also extend beyond the range described in the case of monomeric initiators. In particular, contents of greater than about 50% by weight and up to 100% by weight relative to the weight of the radiation-sensitive mixture, less the contents of the acid-cleavable compound, are included.

The radiation-sensitive mixture according to the invention may additionally comprise a binder which is insoluble in water, but is soluble, or at least swellable, in organic solvents and alkali. Such binders include, above all, phenolic resins of the novolak type. Phenol-formaldehyde resins, cresol-formaldehyde resins, the co-condensates and mixtures thereof, are mentioned.

In addition, it is also possible to employ vinyl polymers, such as poly(vinyl acetals), polymethacrylates, polyacrylates, poly(vinyl ethers), polyvinylpyrrolidones and styrene polymers, in each case optionally modified by comonomers, which are either used alone or mixed with others.

The following may be mentioned in particular: polymers of styrene with alkenyl sulfonyl amino carbonyloxy or cycloalkenyl sulfonyl amino carbonyloxy units (EP-A-0,184,804), polymers of acrylic acid, methacrylic acid, maleic acid, itaconic acid, etc., containing lateral, crosslinking —$CH_2OR$ groups (EP-A-0,184,044), polymers made of vinyl monomers containing alkenylphenol units (EP-A-0,153,682), polyvinylphenols as novolak substitutes (DE-C-2,322,230), polymeric binders containing lateral, phenolic hydroxyl groups (EP-A-0,212,439 and 0,212,440), styrene-maleic anhydride copolymers (DE-A- 3,130,987), polymers made from unsaturated (thio)phosphinic acid iso(thio)-cyanates with a polymer containing active hydrogen (German Patent Applications P 3,615,612.4 and P 3,615,613.2), polymers containing vinyl acetate, vinyl alcohol and vinyl acetal units (EP-A-0,216,083), and poly(vinyl acetals) containing units of hydroxyaldehydes (German Patent Application P 3,644,162.7).

The amount of binder is generally about 1% to 90%, in particular about 5% to 90% by weight, preferably about 50% to 90% by weight, relative to the total weight of the radiation-sensitive mixture.

Additionally, dyes, pigments, plasticizers, wetting agents and levelling agents, but also polyglycols and cellulose ethers, for example, ethylcellulose, may optionally be added to the radiation-sensitive mixtures according to the invention in order to improve specific properties such as flexibility, adhesion and gloss.

The radiation-sensitive mixture according to the invention is preferably dissolved in solvents, such as ethylene glycol, glycol ethers, such as glycol monomethyl ether, glycol dimethyl ether, glycol monoethyl ether or propylene glycol monoalkyl ethers, in particular propylene glycol methyl ether; aliphatic esters, such as ethyl acetate, hydroxyethyl acetate, alkoxyethyl acetate, n-butyl acetate, propylene glycol monoalkyl ether acetate, in particular propylene glycol methyl ether acetate, or amyl acetate; ethers, such as dioxane, ketones, such as methyl ethyl ketone, methyl isobutyl ketone, cyclopentanone and cyclohexanone; dimethylformamide, dimethylacetamide, hexamethylphosphoric amide, N-methylpyrrolidone, butyrolactone, tetrahydrofuran, and in mixtures thereof. Glycol ethers, aliphatic esters and ketones are particularly preferred The solutions produced using the remaining components of the radiation-sensitive mixture generally have a solids content of about 5% to 60% by weight, preferably up to about 50% by weight.

A radiation-sensitive recording material is also provided according to the invention, comprising a substrate and theradiation-sensitive mixture applied thereto.

Suitable substrates are all materials used for capacitors, semiconductors, multilayer printed circuits or integrated circuits.

In particular, surfaces which are made of thermally-oxidized and/or aluminum-coated silicon material and may optionally also be doped may be mentioned, including all other substrates which are customary in semiconductor technology, such as, for example, silicon nitride, gallium arsenide and indium phosphide. In addition, the substrates which are known from the manufacture of liquid-crystal displays, such as glass, indium/tin oxide; metal plates and foils, for example, made of aluminum, copper or zinc; bimetallic and trimetallic foils, and electrically nonconductive foils which are vapor-coated with metals, optionally aluminum-coated $SiO_2$ materials and paper, are suitable. These substrates may be subjected to thermal pretreatment and may be superficially roughened, etched or treated with chemicals in order to achieve desired properties, such as, for example, increased hydrophilicity.

In a particular embodiment, the radiation-sensitive mixture can contain an adhesion promoter for better adhesion, which may be contained in the resist formulation or is applied between the resist and the substrate. In the case of silicon or silicon dioxide substrates, adhesion promoters of the aminosilane type, such as, for example, 3-amino-propyltriethoxysilane or hexamethyldisilazane, are suitable for this purpose.

Examples of supports which can be used for the production of photomechanical recording materials, such as printing forms for letterpress printing, planographic printing, screen printing and rotogravure printing, and for the production of relief copies, are aluminum plates, optionally anodically oxidized, grained and/or silicated aluminum plates, zinc plates, steel plates, which have optionally been coated with chromium, and plastic films or paper.

The recording material according to the invention is irradiated imagewise. Suitable sources of actinic radiation include metal halide lamps, carbon arc lamps, xenon lamps and mercury vapor lamps. Irradiation with high-energy radiation such as laser, electron or X-ray radiation is preferred. Lasers which may be mentioned include, in particular, helium/neon lasers, argon lasers, krypton lasers and helium/cadmium lasers.

The layer thickness of the radiation-sensitive composition varies depending on its field of use. In general, it is between about 0.1 and 100 μm, in particular between about 1 and 10 μm.

The invention furthermore relates to a process for the production of a radiation-sensitive recording material. The radiation-sensitive mixture can be applied to the substrate by spraying, flow-coating roller-coating, spin-coating and dip-coating. The solvent is then removed by evaporation, leaving the radiation-sensitive layer on the surface of the substrate. The removal of the solvent can be accelerated, if desired, by heating the layer to temperatures of up to 150° C. However, it is also possible to initially apply the mixture in the above-mentioned manner to an intermediate support, from which it is transferred onto the final support material under pressure at elevated temperature.

The layer is subsequently irradiated imagewise. Actinic radiation is usually used; UV, X-ray or electron radiation being particularly preferred. UV lamps which emit radiation of wavelength 200 to 500 nm at an intensity of about 0.5 to 60 mW/cm$^2$ are usually used for irradiation. In the radiation-sensitive layer, an image pattern is subsequently produced by treating the layer with a developer solution which dissolves or removes the irradiated areas of the material.

The developers used are solutions of alkaline reagents, such as, for example, silicates, metasilicates, hydroxides, hydrogen phosphates, dihydrogen phosphates, carbonates or hydrogen carbonates, in particular, of alkali metal ions or ammonium ions, but also ammonia, organic ammonium hydroxides and the like. The content of these substances in the developer solution is generally about 0.1 % to 15 % by weight, preferably about 0.5 % to 5 % by weight, relative to the weight of the developer solution.

In order to increase the resistance to mechanical and chemical influences, in particular, to etching media, the developed layers can be heated for some time, for example, about 5 to 40 minutes, at elevated temperature, for example, above 100 ° C., it being possible for this effect to be further supported by exposure with UV radiation.

Preparation of the silylenol ethers used in the radiation-sensitive mixtures according to the invention basically starts from an aldehyde or ketone, which is reacted with an appropriate chlorosilane. It is possible to synthesize bis-silylenol ethers in the case of reactions with dichlorosilanes, and correspondingly higher silylenol ethers with trichlorosilanes or tetrachloro-silanes; these can likewise be used in the radiation-sensitive mixtures according to the invention. The example below is intended to illustrate the preparation method in greater detail.

Preparation of a bis-silylenol ether (I)

0.2 mol of dichlorodimethylsilane and 0.6 mol of triethylamine were introduced into 100 ml of dimethylformamide. 0.35 mol of 2-ethylbutyraldehyde was added dropwise at room temperature with stirring, and the mixture was subsequently heated at 110 ° C. for 4 hours while stirring. After the reaction mixture had been cooled, 100 ml of hexane were added, and the mixture was washed with water. After extraction, the organic phase was subjected to fractional distillation. 19 g of the desired bis-silylenol ether (boiling point: 100° to 113° C./15 torr) were obtained from this procedure. In view of the enolic protons at δ=5.93 ppm, the NMR spectrum showed that the aldehyde functions had been converted entirely into slylenol ether functions.

Likewise, compound II was formed starting from dichlorodimethylsilane and 2-methylcyclohexanone, compound III from dichloromethylphenylsilane and cyclopentanone, compound Iv from chlorotrimethylsilane and p-hydroxyacetophenone, and compound V from chlorodiphenylmethylsilane and cyclopentanone. The analytical values for the compounds mentioned are collated in the table below:

|     |     | Boiling point/pressure | NMR (vinyl) |
| --- | --- | --- | --- |
| I   |     | 110°–113° C./15 torr | 5.93 ppm |
| II  |     | 145° C./15 torr | 4.92 ppm |
| III |     | 122° C./12 torr | 4.78 ppm |
| IV  |     | 125° C./4 torr | 4.19/4.65 ppm |

| | Boiling point/pressure | NMR (vinyl) |
|---|---|---|
| V 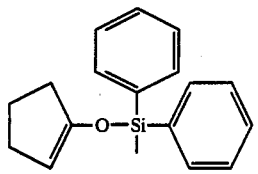 | 128° C./0.1 torr | 4.56 ppm |

The use examples below are intended to illustrate the invention; amounts in these are given in parts by weight (pw).

EXAMPLE 1

A coating solution was produced comprising
4 pw of a cresol-formaldehyde novolak having a softening point of 105°–120° C.,
1 pw of the bis-silylenol ether (I), and
0.1 pw of 2-(2-ethoxynaphth-1-yl)-4,6-bis-trichloromethyl-s-triazine in
85 pw of butanone.

The coating solution was applied in a manner known per se onto a 0.3 mm thick aluminum printing plate support. The aluminum support had previously been electrochemically roughened, anodized and rendered hydrophilic using poly(vinylphosphonic acid). After drying the layer., a layer weight of 1.6 g/m² was obtained.

The offset printing plate produced in this manner was covered with a copying mask containing a continuous-tone wedge, microlines of linewidth between 4 and 75 μm and halftone dots covering and area of 0.5% to 5%. The plate was subsequently irradiated for 20 seconds with radiation from a high-pressure mercury vapor lamp (5 kW) at a distance of 110 cm. The offset plate was developed using an alkaline developer of the composition:
5.3 pw of sodium metasilicate ×9 H₂O,
3.4 pw of trisodium orthophosphate ×12 H₂O,
0.3 pw of sodium dihydrogen phosphate, and
136 pw of demineralized water.

After a development time of 60 seconds, a printing form of high resolution was obtained.

EXAMPLE 2

In this example, a procedure corresponding to Example 1 was followed; however, the silylenol ether employed in this case was 1 pw of compound II. The developed offset printing plate exhibited an equally good resolution as the printing plate obtained in accordance with Example 1.

EXAMPLE 3

A coating solution was produced comprising:
18 pw of a cresol-formaldehyde novolak having a softening point of 105°–120° C.,
3 of the bis-silylenol (III), and
4 pw of tetrabromobisphenol A (Dow Chemical) in
74 pw of propylene glycol methyl ether acetate.

The solution was spin-coated at 3,000 rpm onto a silicon wafer which had been treated with an adhesion promoter (hexamethyldisilazane). After drying at 85° C. for 30 minutes in a circulation oven, a coating thickness of 1 μm was obtained.

Imagewise irradiation was carried out using synchrotron radiation (BESSY, Berlin, air gap 2 mm) in a dose of 35 mJ/cm² through a gold-on-silicon mask. The experimental arrangement of this irradiation variant can be found in A. Heuberger, "X-ray Lithography," *Microelectronc Engineering* 3: 535–556, (1985). The material was developed for 30 seconds at 23° C. using an alkaline developer corresponding to Example 1. All the details were transferred to the image without faults, even when development was carried out for 60 seconds instead of the development time of 30 seconds. The resolving power enabled detection of 0.3 μm lines.

EXAMPLE 4

This example was carried out in corresponding manner to Example 3, but compound III was replaced by compound IV in the same concentration. The results corresponded to those determined in Example 3.

EXAMPLE 5

A silicon wafer was coated with a radiation-sensitive solution in corresponding manner to Example 3, but using compound V as the acid-cleavable material. After drying in a circulation oven in corresponding manner to Example 3, imagewise irradiation was carried out using an electron beam writer at an acceleration voltage of 30 kV with a radiation dose of 0.7 μC/cm².

The wafer was subsequently developed for 30 seconds in a commercially-available developer in corresponding manner to the above-described examples. A flaw-free image with a resolution of 0.3 μm was obtained.

EXAMPLE 6 (COMPARISON EXAMPLE)

The procedure followed was as in Example 1, with the difference that the silylenol ether employed therein was replaced by a polymeric silyl ether (compound 1-8 from DE-A-3,601,264). No differentiation could be achieved at an irradiation time of 20 seconds. Only when this was increased to 260 seconds was differentiation between irradiated and non-irradiated parts of the layer observed.

Even in this case, however, the developer resistance proved to be inadequate. In addition, the detachment of flakes which was observed allowed the conclusion of incompatibility between the binder and the polysilyl ether and was the limiting factor regarding resolution.

What is claimed is:
1. A positive radiation-sensitive mixture, comprising:
a compound which forms an acid under the action of actinic radiation,
a monomeric acid-cleavable compound, and
a binder that is insoluble in water and soluble in aqueous alkaline-solution, wherein the acid-cleavable compound comprises a silylenol ether group of the formula I

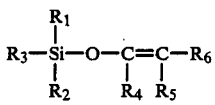

in which
- $R_1$ and $R_2$ are identical of different and denote alkyl, cycloalkyl or aryl,
- $R_3$ denotes alkyl, cycolalkyl, aryl or $-O-R_7$,
- $R_4$, $R_5$ and $R_6$ are identical or different and denote hydrogen, alkyl, cycloalkyl, alkenyl, cycloalkenyl or aryl, and
- $R_7$ denotes hydrogen, alkyl, cycloalkyl, alkenyl, cycloalkenyl, aryl or silyl.

2. A radiation-sensitive mixture as claimed in claim 1, further comprising a second acid-cleavable compound.

3. A radiation-sensitive mixture as claimed in claim 2, where in the second acid-cleavable compound comprises a silyl ether group.

4. A radiation-sensitive mixture as claimed in claim 1, wherein the compound which forms an acid is monomeric.

5. A positive recording material, comprising:
   a substrate; and
   a radiation-sensitive layer on said substrate wherein the layer is produced from a radiation-sensitive mixture as claimed in claim 1.

6. A process for the production of an imaged positive recording material, comprising the steps of:
   applying a radiation-sensitive mixture as claimed in claim 1 to a substrate;
   drying the layer;
   irradiating the dried layer imagewise with actinic radiation, and
   developing the irradiated layer with an aqueous-alkaline developer to produce an image.

7. A process for the production of an imaged positive recording material as claimed in claim 6, wherein the substrate is coated with an adhesion promoter before applying the radiation-sensitive mixture.

8. A radiation-sensitive mixture as claimed in claim 1, wherein $R_1$, $R_2$ and $R_3$ are selected from the group consisting of methyl, phenyl and $-O-R_7$.

9. A radiation-sensitive mixture as claimed in claim 1, wherein $R_7$ is $-CR_4=CR_5-R_6$.

10. A radiation-sensitive mixture as claimed in claim 9, wherein $R_4$ and $R_5$ are cyclized to form a cycloaliphatic ring, and $R_6$ is hydrogen.

11. A radiation-sensitive mixture as claimed in claim 1, wherein $R_3$ is $(C_1-C_6)$alkyl, $(C_5-C_6)$cycloalkyl, $(C_6-C_{10})$aryl, $R_1$ and $R_2$ are identical and denote $(C_1-C_3)$alkyl, $C_5-$ or $C_6$-cycloalkyl or $(C_6-C_{10})$aryl.

12. A radiation-sensitive mixture as claimed in claim 11, wherein no more than two of $R_1$, $R_2$ and $R_3$ denote a cyclic radical.

13. A radiation-sensitive mixture as claimed in claim 12, wherein $R_3$ is $(C_1-C_6)$alkyl.

14. A radiation-sensitive mixture as claimed in claim 13, wherein $R_5$ and $R_6$ are hydrogen and $R_4$ is alkenyl or cycloalkyl.

15. A radiation-sensitive mixture as claimed in claim 15, wherein $R_4$ and $R_5$ are cyclized to form a cycloaliphatic ring and $R_6$ is hydrogen, alkenyl or aryl.

16. A radiation-sensitive mixture as claimed as claimed in claim 15, wherein $R_6$ is hydrogen 17. A radiation-sensitive mixture as claimed in claim 1, wherein the acid-cleavable compound comprises a silylenol ether group of the formula I in which:
- $R_1$ and $R_2$ are identical or different and denote $(C_1-C_3)$alkyl, $C_5-$ or $C_6$-cycloalkyl or $(C_6-C_{10})$aryl;
- $R_3$ denotes $(C_1-C_6)$alkyl, $C_5-$ or $C_6$-cycloalkyl, $(C_6-C_{10})$aryl, or $-O-R_7$;
- $R_4$, $R_5$ and $R_6$ are identical or different and denote hydrogen, $(C_1-C_3)$alkyl, alkenyl, cycloalkenyl or aryl, the C—C double bonds in these radicals being conjugated with the double bond in $-CR_4=CR_5-$, and $(C_1-C_6)$alkenyl and $C_5-$ or $C_6$ cycloalkenyl provide only one double bond for conjugation; or aryl which may be substituted or etherfied with alkyl- or arylhalosilanes; and
- $R_7$ denotes $(C_1-C_6)$alkyl, $(C_5-C_{10})$cycloalkyl, $(C_1-C_6)$alkenyl, $(C_5-C_{10})$cycloalkenyl and $(C_6-C_{10})$aryl.

18. A radiation-sensitive mixture as claimed in claim 17, wherein the acid-cleavable compound comprises a silylenol ether group of the formula I in which $R_1$, $R_2$ and $R_3$ are methyl or phenyl.

* * * * *